(12) United States Patent
Lenz

(10) Patent No.: US 8,464,736 B1
(45) Date of Patent: Jun. 18, 2013

(54) RECLAIM CHEMISTRY

(75) Inventor: Eric Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1304 days.

(21) Appl. No.: 11/731,102

(22) Filed: Mar. 30, 2007

(51) Int. Cl.
*B08B 3/04* (2006.01)

(52) U.S. Cl.
USPC ... 134/104.2; 134/94.1; 134/95.1; 134/103.1; 134/108; 134/111

(58) Field of Classification Search
USPC .................. 134/94.1, 103.1, 108, 111, 199
See application file for complete search history.

(56) References Cited

U.S. PATENT DOCUMENTS

| | | |
|---|---|---|
| 3,953,265 A | 4/1976 | Hood |
| 4,086,870 A | 5/1978 | Canavello et al. |
| 4,367,123 A | 1/1983 | Beck |
| 4,444,492 A | 4/1984 | Lee |
| 4,838,289 A | 6/1989 | Kottman et al. |
| 5,102,494 A | 4/1992 | Harvey et al. |
| 5,180,431 A | 1/1993 | Sugimoto et al. |
| 5,271,774 A | 12/1993 | Leenaars et al. |
| 5,294,257 A | 3/1994 | Kelly et al. |
| 5,343,234 A | 8/1994 | Kuehnle |
| 5,361,449 A | 11/1994 | Akimoto |
| 5,472,502 A | 12/1995 | Batchelder |
| 5,558,111 A | 9/1996 | Lofaro |
| 5,601,655 A | 2/1997 | Bok et al. |
| 5,654,034 A | 8/1997 | Tulloch et al. |
| 5,660,642 A | 8/1997 | Britten |
| 5,696,348 A | 12/1997 | Kawamura et al. |
| 5,705,223 A | 1/1998 | Bunkofske |
| 5,709,757 A | 1/1998 | Hatano et al. |
| 5,807,522 A | 9/1998 | Brown et al. |
| 5,820,686 A | 10/1998 | Moore |
| 5,830,334 A | 11/1998 | Kobayashi |
| 5,882,433 A | 3/1999 | Ueno |
| 5,893,004 A | 4/1999 | Yamamura |
| 5,945,351 A | 8/1999 | Mathuni |
| 5,975,098 A | 11/1999 | Yoshitani et al. |
| 5,989,478 A | 11/1999 | Ouellette et al. |
| 5,997,653 A | 12/1999 | Yamasaka |
| 6,086,454 A | 7/2000 | Watanabe et al. |

(Continued)

FOREIGN PATENT DOCUMENTS

| | | |
|---|---|---|
| EP | 0 905 746 A1 | 3/1999 |
| EP | 0 905 747 A1 | 3/1999 |

(Continued)

OTHER PUBLICATIONS

J.A. Britten, "A moving-zone Marangoni drying process for critical cleaning and wet processing," Oct. 1997, *Solid State Technology*.

(Continued)

*Primary Examiner* — Eric Golightly
(74) *Attorney, Agent, or Firm* — Martine Penilla Group, LLP

(57) ABSTRACT

Systems, apparatus and methods are provided for efficiently reclaiming solvents used to clean surfaces of semiconductor wafers, etc. More particularly, embodiments of the present invention provide a reclaim approach that prevents the evaporation of chemical solvents used to process wafers using proximity heads, by confining hot liquid solvents used to form fluid menisci on the wafer surface with cold liquid solvents of the same chemical composition.

16 Claims, 5 Drawing Sheets

U.S. PATENT DOCUMENTS

| | | | |
|---|---|---|---|
| 6,092,937 | A | 7/2000 | Snodgrass et al. |
| 6,103,636 | A | 8/2000 | Zahorik et al. |
| 6,108,932 | A | 8/2000 | Chai |
| 6,132,586 | A | 10/2000 | Adams et al. |
| 6,169,244 | B1 | 1/2001 | Carlos et al. |
| 6,214,513 | B1 | 4/2001 | Cai et al. |
| 6,230,722 | B1 | 5/2001 | Mitsumori et al. |
| 6,341,998 | B1 | 1/2002 | Zhang |
| 6,391,166 | B1 | 5/2002 | Wang |
| 6,398,975 | B1 | 6/2002 | Mertens et al. |
| 6,417,117 | B1 | 7/2002 | Davis |
| 6,433,541 | B1 | 8/2002 | Lehman et al. |
| 6,446,358 | B1 | 9/2002 | Mitsumori et al. |
| 6,474,786 | B2 | 11/2002 | Percin et al. |
| 6,488,040 | B1 | 12/2002 | De Larios et al. |
| 6,491,764 | B2 | 12/2002 | Mertens et al. |
| 6,495,005 | B1 | 12/2002 | Colgan et al. |
| 6,514,570 | B1 | 2/2003 | Matsuyama et al. |
| 6,530,823 | B1 | 3/2003 | Ahmadi et al. |
| 6,531,206 | B2 | 3/2003 | Johnston et al. |
| 6,550,988 | B2 | 4/2003 | Sugimoto et al. |
| 6,555,017 | B1 | 4/2003 | Rushford et al. |
| 6,616,772 | B2 | 9/2003 | De Larios et al. |
| 6,629,540 | B2 | 10/2003 | Mitsumori et al. |
| 6,689,323 | B2 | 2/2004 | Fisher et al. |
| 6,764,720 | B2 | 7/2004 | Pui et al. |
| 6,799,584 | B2 | 10/2004 | Yogev et al. |
| 6,851,435 | B2 | 2/2005 | Mertens et al. |
| 6,854,473 | B2 | 2/2005 | Hanson et al. |
| 6,954,993 | B1 * | 10/2005 | Smith et al. .............. 34/407 |
| 6,988,326 | B2 * | 1/2006 | O'Donnell et al. .......... 34/381 |
| 6,988,327 | B2 | 1/2006 | Garcia et al. |
| 7,000,622 | B2 | 2/2006 | Woods et al. |
| 7,069,937 | B2 | 7/2006 | Garcia et al. |
| 7,093,375 | B2 * | 8/2006 | O'Donnell .................... 34/79 |
| 7,153,400 | B2 | 12/2006 | Ravkin et al. |
| 7,193,232 | B2 | 3/2007 | Lof et al. |
| 7,234,477 | B2 | 6/2007 | de Larios et al. |
| 7,240,679 | B2 | 7/2007 | Woods |
| 7,252,097 | B2 | 8/2007 | Boyd et al. |
| 7,520,285 | B2 * | 4/2009 | Garcia .................... 134/98.1 |
| 2002/0121290 | A1 | 9/2002 | Tang et al. |
| 2003/0091754 | A1 | 5/2003 | Chihani et al. |
| 2003/0092264 | A1 | 5/2003 | Kajita et al. |
| 2004/0062874 | A1 * | 4/2004 | Kim et al. .................. 427/421 |
| 2004/0069319 | A1 | 4/2004 | Boyd et al. |
| 2005/0132515 | A1 | 6/2005 | Boyd et al. |
| 2005/0139318 | A1 | 6/2005 | Woods et al. |
| 2005/0145265 | A1 | 7/2005 | Ravkin et al. |
| 2005/0145267 | A1 | 7/2005 | Korolik et al. |
| 2005/0145268 | A1 | 7/2005 | Woods |
| 2005/0148197 | A1 | 7/2005 | Woods et al. |
| 2005/0217703 | A1 | 10/2005 | O'Donnell |
| 2008/0149147 | A1 * | 6/2008 | Wilcoxson et al. ........ 134/95.2 |

FOREIGN PATENT DOCUMENTS

| | | |
|---|---|---|
| EP | 1 489 461 A1 | 12/2004 |
| EP | 1 489 462 A2 | 12/2004 |
| EP | 1 571 697 A1 | 9/2005 |
| JP | 05837190 | 3/1983 |
| JP | 62150828 A | 7/1987 |
| JP | 02280330 | 11/1990 |
| JP | 02309638 | 12/1990 |
| JP | 11031672 | 2/1992 |
| JP | 08277486 | 10/1996 |
| JP | 9199488 | 7/1997 |
| JP | 11350169 | 12/1999 |
| JP | 2001220688 | 8/2001 |
| JP | 2003-151948 | 5/2003 |
| TW | 480221 | 3/2002 |
| TW | 483075 | 4/2002 |
| TW | 503455 | 9/2002 |
| TW | 542791 | 7/2003 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 A3 | 2/2003 |
| WO | WO 03/087436 A1 | 10/2003 |
| WO | WO 2004/030051 A2 | 4/2004 |

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

U.S. Appl. No. 10/834,548, filed Apr. 28, 2004, Hemker et al.
U.S. Appl. No. 11/173,729, filed Jun. 30, 2005, Ravkin et al.

\* cited by examiner

RECLAIM CHEMISTRY

BACKGROUND

1. Field of the Invention

The invention relates generally to semiconductor wafer processing and, more particularly, to apparatus and methods for eliminating chemical loss during the processing of semiconductor wafer surfaces.

2. Description of the Related Art

In electronic device manufacturing operations, expensive proprietary chemical mixtures or blends customarily referred to as "solvents" or "proprietary solvents" are widely used to remove particulate contaminants, post-etch residue, and metal contamination from semiconductor wafer surfaces and to etch, rinse, dry, etc. semiconductor wafer surfaces. Such chemical solvents generally fall into two generic classes: "aqueous-based" solvents and "organic-based" solvents. Aqueous-based solvents are processing chemistries which are water-based (i.e. are up to 95% water by weight with the active chemical agents making up the remainder). Organic-based solvents are processing chemistries for which water is replaced by a liquid organic chemical, or mixtures thereof, that also contains active chemical agents for processing semiconductor wafer surfaces. Because of the expense of obtaining these solvents, they are typically reclaimed after processing and re-used.

FIG. 1 illustrates a conventional liquid chemical reclaim system 100. In FIG. 1, a hot chemical solvent is applied to a surface 104 of a semiconductor wafer 106 from a supply tank 108 via a supply line 112, to create a chemical meniscus 102. The chemical meniscus 102 acts to process the semiconductor wafer surface 104. Ambient air flow 103 is applied to the chemical meniscus 102 to prevent the meniscus 102 from breaking out of a defined footprint and flooding the semiconductor wafer surface 104. As the proximity head 110 moves along the semiconductor wafer surface 104, the chemical solvent of the meniscus 102 operates on the semiconductor wafer surface 104. The chemical solvent is removed from the semiconductor wafer surface 104 using a vacuum mechanism. Specifically, this vacuum mechanism draws the air and chemical solvent from the surface 104 of the semiconductor wafer 106, out of the proximity head 110, and into a vacuum tank 114 via an air-liquid return line 116 coupled to the vacuum tank 114. At the vacuum tank 114, the chemical solvent is separated from the air and the air is pumped out of the vacuum tank 114 via an exhaust 118. Reclaim of the chemical solvent is achieved by recirculation of the chemical solvent from the vacuum tank 114 back to the supply tank 108 via a liquid pump 120.

Evaporation of the chemical solvent in conventional liquid reclaim systems using a proximity head 110 similar to the system 100 illustrated in FIG. 1 is a serious issue. Specifically, evaporation loss is currently difficult to control due to the proximity head 110 having high ambient air flow 103 mixed with the hot chemical solvent returning from the edge 105 of the chemical meniscus 102. The proprietary chemical solvents used to form the chemical meniscus 102 are commonly used at elevated temperatures, (e.g. 30 degrees Celsius to 60 degrees Celsius) to get improved processing performance. Since evaporation is determined by vapor pressure, which exponentially increases with temperature, chemical loss can dramatically increase when the hot chemical solvent mixes with the air flow 103 at the meniscus edge 105 region. This exponential increase in evaporation of the chemical solvent can cause a corresponding dramatic decrease in the usable lifetime of a chemical solvent bath.

Moreover, evaporation can result in significant changes in cleaning performance due to chemical solvent depletion and/or excessive concentration of chemicals. Chemical solvent depletion occurs because, during standard operation of a two-phase return proximity head 110, there is a significant mixing of the hot chemical meniscus liquid and the ambient air flow 103 on the way to the vacuum tank 114. Therefore, the air (gas) stream that exists in the vacuum tank 114 through the exhaust 118 is saturated with every component of the volatile chemical solvent. And the chemical solvent included in the saturated gas (air) stream is not reclaimed once the saturated gas (air) stream is out of the vacuum tank 114 and before the saturated gas (air) stream is sent to purification scrubbers. Excessive concentration of chemicals, on the other hand, commonly results with the use of proprietary solvents. Proprietary solvents contain non-volatile components and, if the proprietary solvent is aqueous-based, evaporation causes the concentration of non-volatile components to increase over time. This increase in the concentration of non-volatile components can adversely affect the cleaning performance of the chemical solvent. Moreover, damage to the semiconductor wafer 106 can result if the concentration of non-volatile components increases too much.

A conventional approach for reducing chemical solvent loss by evaporation involves the use of a condenser to separate out the liquid chemical solvent entrained in the two-phase return of a proximity head. However, because of the size of conventional condensers their use can significantly and unnecessarily increase the size of a wafer processing system.

In view of the foregoing, there is a need for a reclaiming approach that reduces chemical loss due to evaporation and other sources.

SUMMARY

In one embodiment, the present invention provides a liquid reclaim system. The liquid reclaim system comprises a proximity head capable of generating a first fluid meniscus and a second fluid meniscus on a surface of a wafer. The second fluid meniscus is configured to confine the first fluid meniscus to prevent evaporation of a hot fluid chemistry included in the first fluid meniscus into a gas where the gas is applied to the second fluid meniscus to confine the first fluid meniscus and the second fluid meniscus to a footprint on the wafer surface. In the liquid reclaim system, the proximity head includes at least one first inlet configured to supply the hot liquid chemistry to the first fluid meniscus and at least one second inlet configured to supply a cold liquid chemistry to the second fluid meniscus.

In another embodiment, the present invention provides a method for preventing evaporation loss of liquid chemistry. The method comprises supplying a hot liquid chemistry to form a first fluid meniscus on a surface of a wafer and supplying a cold liquid chemistry to form a second meniscus on the wafer surface, where the second fluid meniscus surrounds the first fluid meniscus. The method further comprises applying a gas to the second fluid meniscus formed on the wafer surface where the gas is applied to the second fluid meniscus to confine the first fluid meniscus and the second fluid meniscus to a footprint on the wafer surface, and where a gas-cold liquid chemistry mixed area is created at an edge of the second fluid meniscus. According to the embodied method, the temperature of the cold liquid chemistry is provided to produce a gas phase equilibrium that prevents evaporation of the cold liquid chemistry into the gas.

Other aspects and advantages of the invention will become apparent from the following detailed description, taken in conjunction with the embodiments and accompanying drawings, illustrating, by way of example, the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Embodiments of the present invention provide systems, apparatus, and methods for efficiently reclaiming solvents used to process surfaces of semiconductor wafers, etc. More particularly, embodiments of the present invention provide a reclaim approach that prevents the evaporation of chemical solvents used to process wafers using proximity heads, by confining hot liquid chemistries used to form fluid menisci on the wafer surface with cold liquid chemistries of the same chemical composition. The cold liquid chemistry provides a barrier between a hot liquid chemistry and a gas-cold liquid chemistry mixed area at an outer edge of the cold fluid meniscus where significant evaporation would typically occur due to the mixing of high air flow with the hot liquid chemistry returning from the edge of a hot fluid meniscus. Likewise, the cold liquid chemistry also reduces overall chemical solvent depletion due to evaporation that can occur during standard operation of a two-phase return proximity head when there is significant mixing of the cold liquid chemistry and the gas air flow in an outlet of the proximity head. In other words, since evaporation is determined by the temperature of a liquid and the amount of vapor pressure in a gas (i.e. partial pressure of the vapor) that is above the liquid surface, chemical loss can be dramatically decreased by using cold liquid chemistries to produce a gas phase equilibrium that prevents evaporation of the cold liquid chemistry into the gas during a mixing of the gas and the cold liquid chemistry.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention. The present invention includes several aspects and is presented below and discussed in connection with the Figures and embodiments.

Figure 1:
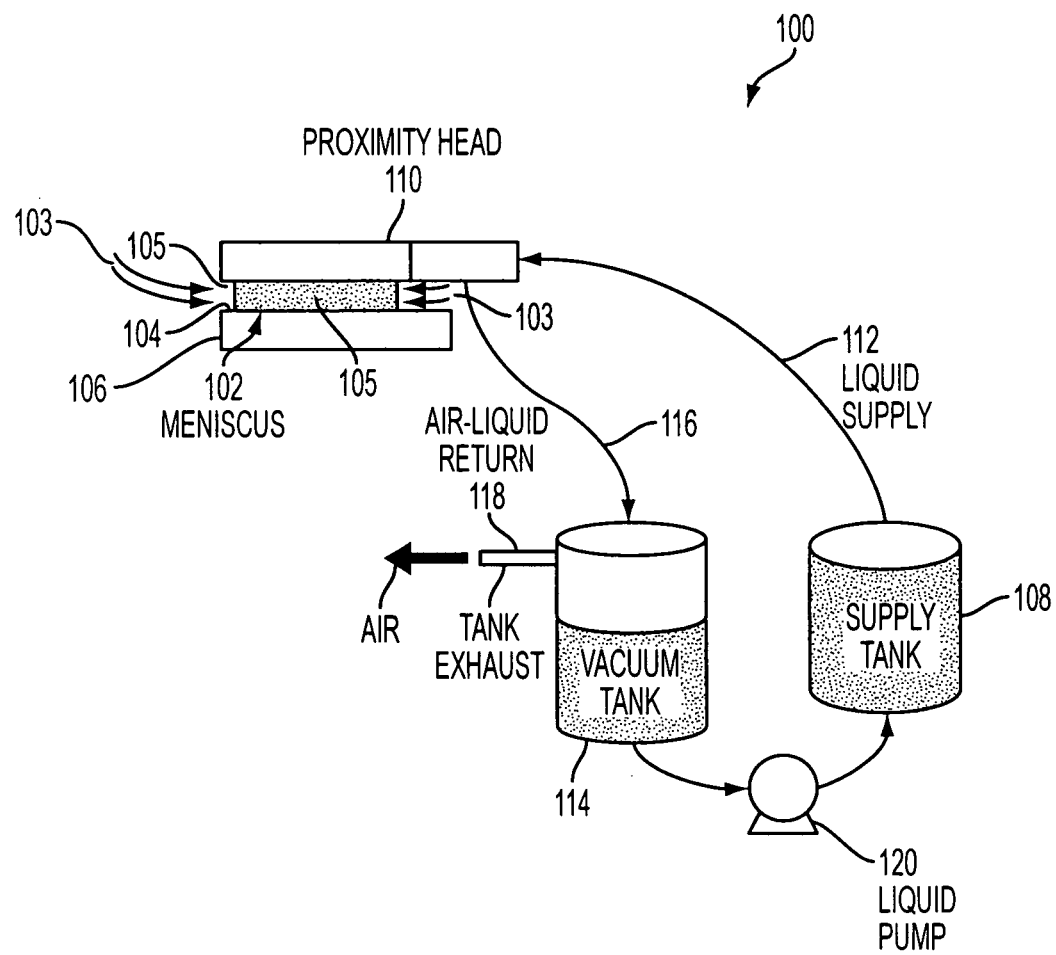
FIG. 1 illustrates a block view of a conventional liquid chemical reclaim system.
Figure 2:
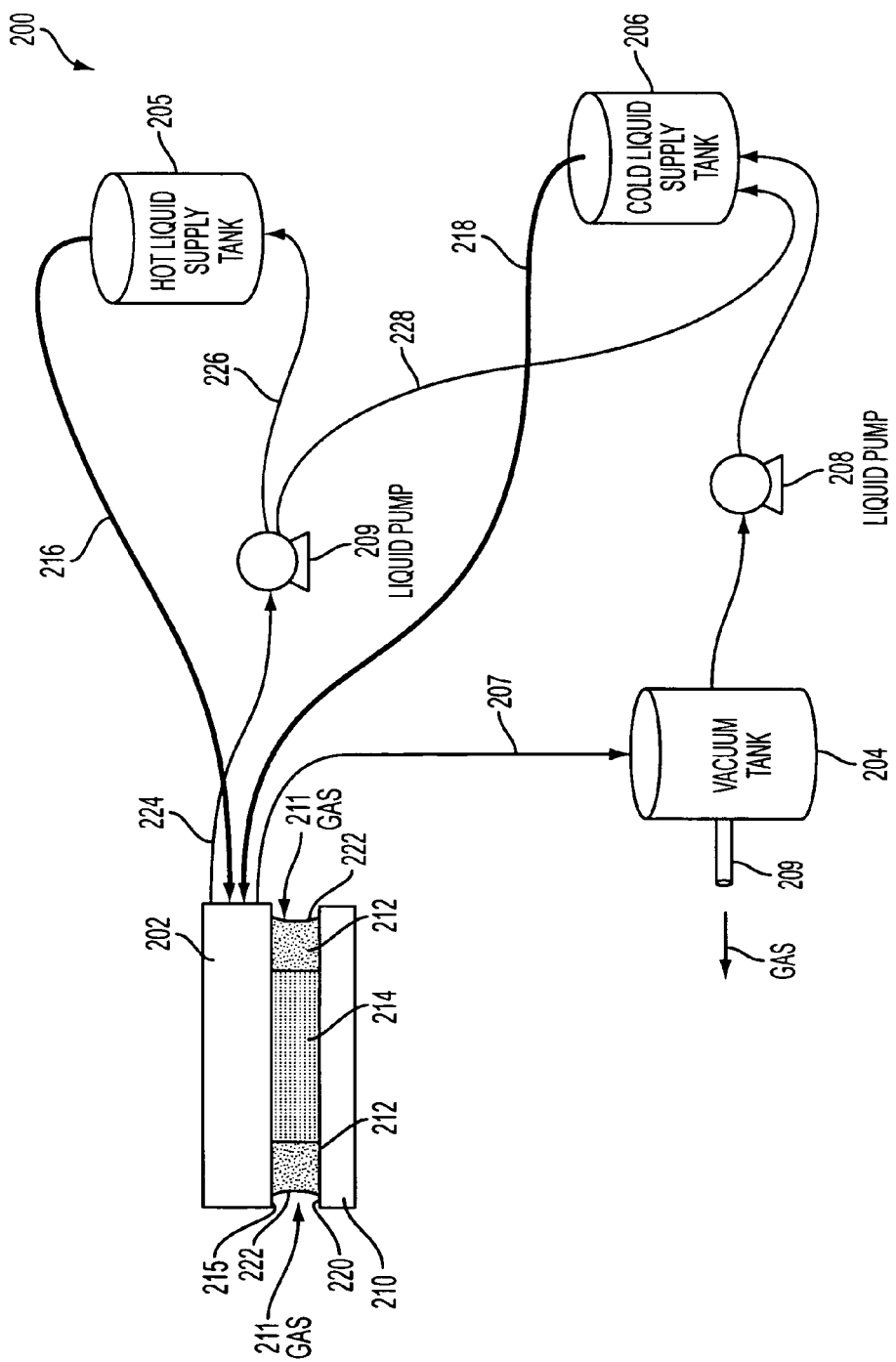
FIG. 2 illustrates a block view of a reclaim system, in accordance with one embodiment of the present invention.

In FIG. 2, according to one embodiment of the present invention, a liquid chemical reclaim system 200 is illustrated. The system 200 includes a multi-meniscus proximity head 202 that can generate first fluid meniscus 214 and second fluid meniscus 212 on surface 220 of wafer 210 such that first fluid meniscus 214 and second fluid meniscus are contained in a controlled manner between head surface 215 and wafer surface 220. In one embodiment, the second fluid meniscus 212 is in contact with and substantially surrounds the first fluid meniscus 214. In another embodiment, second fluid meniscus 212 is in contact with and at least partially surrounds first fluid meniscus 214. It is important to note that first fluid meniscus 214 can be any suitable geometric shape including, but not limited to, a circle, ellipse, square, rectangle, triangle, quadrilateral, etc. Likewise, second fluid meniscus 212 can be configured in any manner that substantially or partially surrounds first fluid meniscus 214 thereby confining first fluid meniscus 214.

The system 200 further includes a vacuum tank 204 coupled to cold liquid chemical supply tank 206 via first liquid pump 208. The vacuum tank 204 is further coupled to one or more outlets 304b (see FIGS. 3A and 3C) included in the proximity head 202 via a vacuum return line 207. The system 200 also includes hot liquid chemical supply tank 205 which is coupled to one or more inlets 306a (see FIGS. 3A and 3C) of proximity head 202 via supply line 216. Similarly, the system 200 includes cold liquid chemical supply tank 206 which is coupled to one or more inlets 306b (see FIGS. 3A and 3C) of proximity head 202 via supply line 218. Also included in the system 200 is a second liquid pump 209 that is coupled to one or more outlets 304a (see FIGS. 3A and 3C) included in proximity head 202, via a first return line 224. The second liquid pump 209 is further coupled to hot liquid chemical supply tank 205 and cold liquid chemical supply tank 206 respectively, via second return line 226 and third return line 228.

In the system 200, a hot liquid chemistry is supplied to first fluid meniscus 214 from hot liquid chemical supply tank 205. A cold liquid chemistry is supplied to second fluid meniscus 212 from cold liquid chemical supply tank 206. More particularly, as described in further detail in FIG. 3, the hot liquid chemistry is supplied to first fluid meniscus 214 via one or more fluid inlets 306a (see FIGS. 3A and 3C) of proximity head 202 where hot liquid chemistry travels along inlet 306a to form first fluid meniscus 214 on surface 220 of semiconductor wafer 210. Similarly, the cold liquid chemistry is supplied to second fluid meniscus 212 via one or more fluid inlets 306b (see FIGS. 3A and 3C) of proximity head 202 where the cold liquid chemistry travels along fluid inlet 306b to form second fluid meniscus 212 on wafer surface 220. In one embodiment, the hot liquid chemistry has the same chemical composition as the cold liquid chemistry. Moreover, in one embodiment, the hot liquid chemistry and the cold liquid chemistry can be any fluid(s) suitable for a desired wafer processing operation. For example, the hot liquid chemistry and the cold liquid chemistry can be any fluid(s) suitable for conducting operations on a wafer surface such as etching, lithography, cleaning, rinsing, and drying. In one embodiment, a temperature of the hot liquid chemistry can be from approximately 30 degrees Celsius to approximately 80 degrees Celsius and a temperature of the cold liquid chemistry can be from approximately 5 degrees Celsius to approximately 20 degrees Celsius.

According to one embodiment of the present invention, gas 211 is applied to second fluid meniscus 212 to prevent first fluid meniscus 214 and second fluid meniscus 212 from breaking out of a defined footprint and flooding semiconductor wafer surface 220. In one embodiment, gas 211 can be ambient air, or inert gases such as nitrogen, helium, argon, etc. However, embodiments of the present invention are not limited to a particular type of gas 211. Then as proximity head 202 moves along the semiconductor wafer surface 220, the hot liquid chemistry supplied to first fluid meniscus 214 operates on wafer surface 220 to process (e.g. clean, dry, etch, etc.) the wafer surface 220.

In one embodiment, a mixture of the hot liquid chemistry and the cold liquid chemistry is removed from the semiconductor wafer surface 220 using a pumping mechanism. More particularly, the pumping mechanism draws the hot and cold liquid chemistry mixture from wafer surface 220 and out of proximity head 202 through outlet 304a (see FIGS. 3A and 3C) to second liquid pump 208 via first return line 224. The mixture is then pumped into hot liquid chemical supply tank 205 and cold liquid chemical supply tank 206 via second return line 226 and third return line 228 respectively. It is important to note however that embodiments of the present invention are not limited to a particular mechanism for drawing the hot and cold liquid chemistry mixture from the wafer surface and into hot supply tank 205 and cold supply tank 206. In one embodiment, reclaim of the hot and cold liquid chemistry mixture removed from the wafer surface 220 is achieved by recirculation of the hot liquid chemistry from liquid supply tank 205 and the cold liquid chemistry from liquid supply tank 206 back into proximity head 202 respectively via inlets 306a and 306b.

In one embodiment, a mixture of gas 211 and the cold liquid chemistry is removed from semiconductor wafer surface 220 using a vacuum mechanism. Specifically, the vacuum mechanism draws gas 211 and the cold liquid chemistry from wafer surface 220 and out of proximity head 202 through outlet 304b (see FIGS. 3A and 3C) and into vacuum tank 204 via air-liquid return line 207. At vacuum tank 204, the cold liquid chemistry is separated from gas 211. Gas 211 is then pumped out of vacuum tank 204 via exhaust 209 and reclaim of the cold liquid chemistry is achieved by recirculation of the cold liquid chemistry from vacuum tank 204 back to cold liquid supply tank 206 via liquid pump 208. It is important to note however that embodiments of the present invention are not limited to a particular vacuum mechanism for separating the cold liquid chemistry from gas 211 or for drawing the hot and cold liquid chemistry mixture from the wafer surface 220 and into hot supply tank 205 and cold supply tank 206.

Referring still to FIG. 2, according to an embodiment of the present invention, the cold liquid chemistry is supplied to second fluid meniscus 212 to prevent evaporation of the hot liquid chemistry of first fluid meniscus 214 into gas 211. As mentioned above, in conventional systems, evaporation loss of hot liquid chemistry occurs when gas mixes with hot liquid chemistry returning from an edge of a meniscus formed on a wafer surface. According to an embodiment of the present invention, evaporation loss of the hot liquid chemistry of first fluid meniscus 214 is avoided by confining first fluid meniscus 214 within second fluid meniscus 212 which is supplied from a cold liquid chemistry of the same chemical composition as the hot liquid chemistry. For example, in one embodiment, evaporation loss of the hot liquid chemistry is avoided because only the hot liquid chemistry and some portion of the cold fluid chemistry mix in outlet 304a. In other words, the mixing of the hot fluid chemistry and gas 211 is prevented. A further advantage of the mixing of the hot liquid chemistry and the cold liquid chemistry is the cold liquid chemistry can cool the hot liquid chemistry returning from the wafer surface 220 via outlet 304a and further reduce the potential for evaporation loss. In another embodiment, because a temperature of the cold liquid chemistry is selectively chosen to produce a gas phase equilibrium that prevents evaporation of a remaining portion of the cold liquid chemistry during mixing with gas 211 at edge 222 of second fluid meniscus 212, evaporation loss of the cold liquid chemistry is likewise avoided.

Figure 3A:
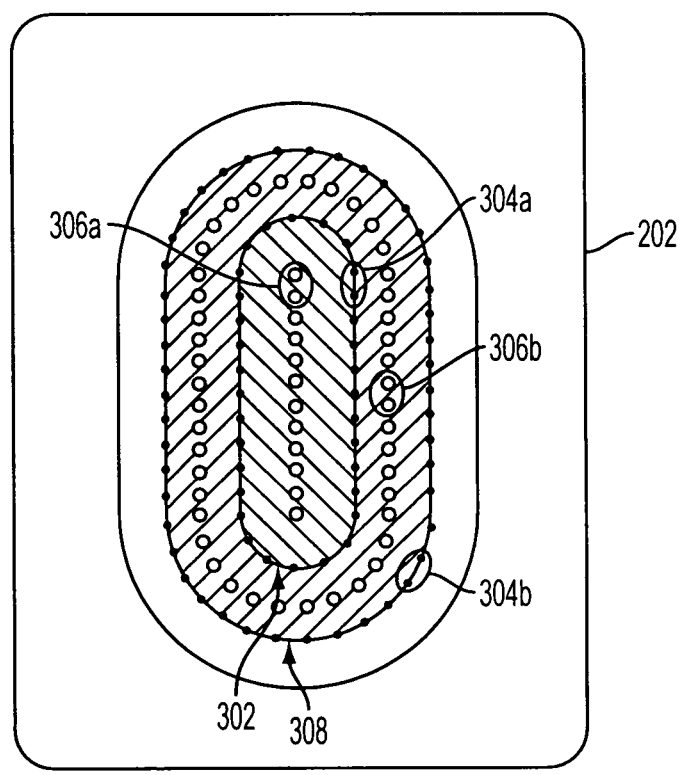
FIG. 3A illustrates a top view of an exemplary two-phase multi-meniscus proximity head, in accordance with one embodiment of the present invention.

In FIG. 3A, a closer top view processing surface 215 of the exemplary multi-meniscus two-phase proximity head 202 shown in FIG. 2 is illustrated according to one embodiment of the present invention. In one embodiment, processing surface 215 includes a first fluid meniscus region 302 that includes hot fluid inlets 306a and hot/cold fluid outlets 304a. Processing surface 215 further includes a second fluid meniscus region 308 that includes cold fluid inlets 306b and cold/gas fluid outlets 304b. In this way, first fluid meniscus region 302 can generate first fluid meniscus 214 and second fluid meniscus region 308 can generate second fluid meniscus 212.

Figure 3B:
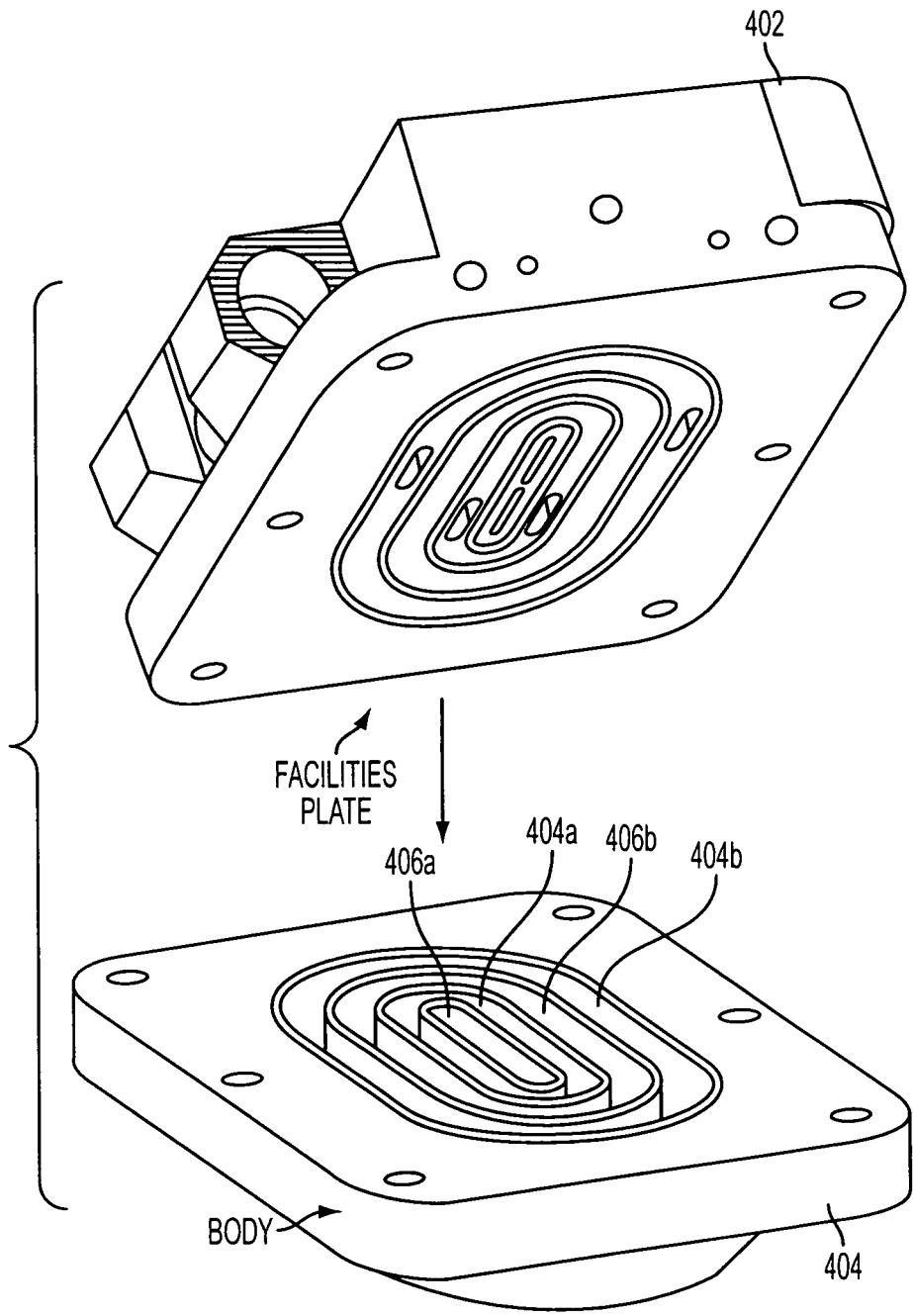
FIG. 3B illustrates a facilities plate attaching to a body to form a two-phase multi-meniscus proximity head, in accordance with one embodiment of the present invention.

In FIG. 3B, facilities plate 402 attaching to body 404 to form multi-meniscus proximity head 202 is illustrated according to one embodiment of the present invention. Channels corresponding to hot fluid inlets 306a and cold fluid inlets 306b respectively supply hot liquid chemistry and cold liquid chemistry from facilities plate 402 to body 404 of multi-meniscus proximity head 202. Likewise, channels corresponding to hot/cold fluid outlets 304a and cold/gas fluid outlets 304b remove a mixture of the hot liquid chemistry and the cold liquid chemistry and a mixture of the cold liquid chemistry and gas 211 from body 404 to facilities plate 402. In one embodiment of the present invention, channels 406a, 406b, 404a, and 404b respectively correspond to hot fluid inlets 306a, cold fluid inlets 306b, hot/cold fluid outlets 304a, and cold/gas fluid outlets 304b.

Figure 3C:
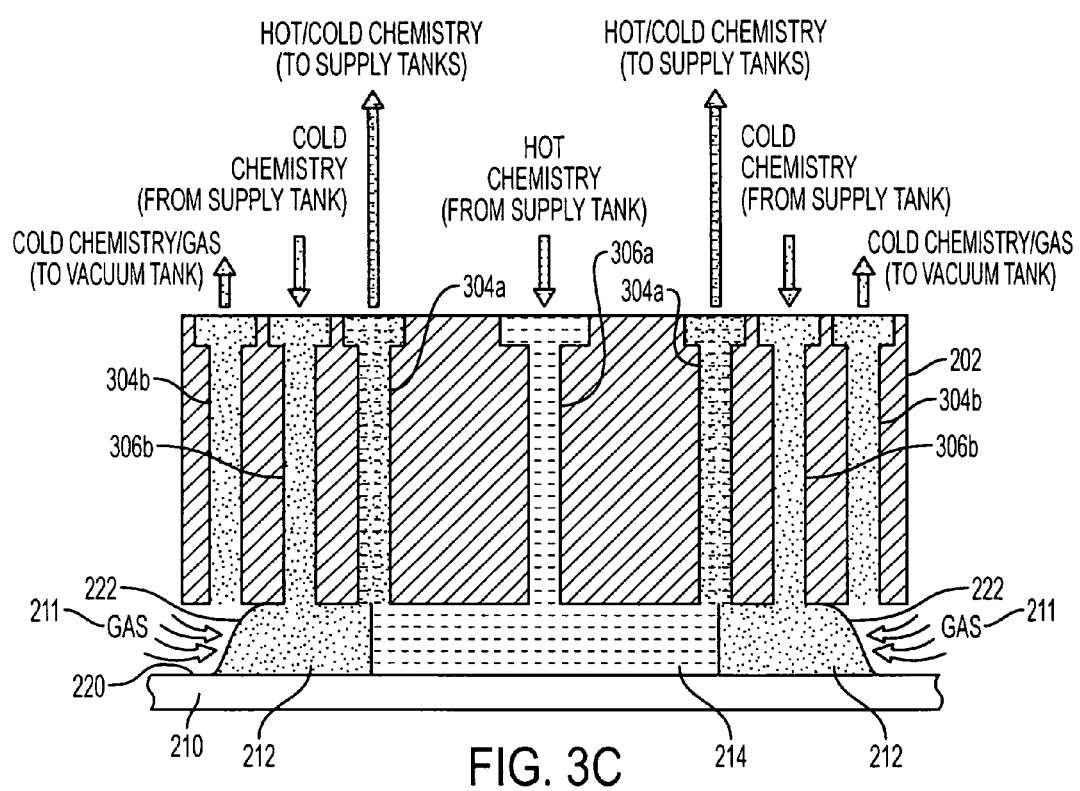
FIG. 3C illustrates a cross-sectional view of the two-phase multi-meniscus proximity head in exemplary wafer processing operations, in accordance with one embodiment of the present invention.

In FIG. 3C, a cross-section view of proximity head 202 is illustrated according to one embodiment of the present invention. In one embodiment, a hot liquid chemistry is applied to the wafer 210 through hot fluid inlet 306a to create first fluid meniscus 214 and a cold liquid chemistry is applied to wafer 210 through cold fluid inlet 306b to create second fluid meniscus 212. In one embodiment, second fluid meniscus 212 can substantially surround first fluid meniscus 214. In another embodiment, second fluid meniscus 212 can at least partially surround whatever shape first fluid meniscus 212 may be. In either case, second fluid meniscus 212 is configured to confine first fluid meniscus 214 to prevent evaporation of the hot liquid chemistry that forms first fluid meniscus 214 into gas 211.

Gas 211, as previously mentioned, is applied to second fluid meniscus 212 to prevent first fluid meniscus 214 and second fluid meniscus 212 from breaking out of a defined footprint and flooding the semiconductor wafer surface 220 during processing. According to one embodiment of the present invention, second fluid meniscus 212 provides a barrier between first fluid meniscus 214 and a gas-cold liquid chemistry mixed area at outer edge 222 of second fluid meniscus 212 where significant evaporation would typically occur due to the mixing of high air flow 211 with the hot liquid chemistry returning from an edge of a meniscus. In one embodiment, the cold liquid chemistry supplied to second fluid meniscus 212 has the same chemical composition as the hot liquid chemistry supplied to first fluid meniscus 214. In one embodiment, the hot fluid chemistry can have a temperature of from approximately 30 degrees Celsius to approximately 80 degrees Celsius. In one embodiment, the cold liquid chemistry can have a temperature of from approximately 5 degrees Celsius to approximately 20 degrees Celsius. However, it is important not note that the cold liquid chemistry can be selected to have any temperature provided to produce a gas phase equilibrium that prevents evaporation of the cold liquid chemistry into gas 211.

Referring still to FIG. 3C, after the hot liquid chemistry has processed wafer surface 220, the hot liquid chemistry and the cold liquid chemistry are removed from wafer surface 220 through hot/cold fluid outlet 304a. Likewise, the cold liquid chemistry and gas 211 are removed through cold/gas fluid outlet 304b. Because significant mixing of the cold liquid chemistry and gas 211 can occur in outlet 304b the temperature of the cold liquid chemistry reduces overall chemical solvent depletion due to evaporation that can occur during standard operation of a two-phase return proximity head, according to one embodiment of the present invention.

In view of the discussion above, is should be apparent that embodiments of the present invention provide a capability to reclaim evaporated liquid chemistry components before these components ever leave a reclaim system. Embodiments of the present invention also eliminate the extra tanks, pumps, etc. that are needed when volatile components are condensed out of conventional reclaim systems. Moreover, embodiments of the present invention eliminate the need for evaporation compensation strategies such as concentration monitoring and chemical spiking.

It should be appreciated that the systems and proximity heads as described herein are exemplary in nature, and that any other suitable types of configurations that would prevent chemical solvent evaporation by using cold liquid chemistries and enable the generation and movement of a meniscus or enable a meniscus with a cavity enclosed therein may be utilized. For example, various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." The aforementioned patents and patent applications are hereby incorporated by reference in their entirety.

In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In other embodiments, either or both of the wafer and the proximity head do not move depending on the wafer processing operation and the configuration of the proximity head. In further embodiments, the proximity head may be held stationary and the wafer may be moved to be processed by the fluid meniscus. As with the proximity head, the wafer may move in any suitable motion as long as the desired wafer processing operation is accomplished.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer that is being processed, and in another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A liquid reclaim system, comprising:
(a) a proximity head capable of generating a first fluid meniscus and a second fluid meniscus on a surface of a wafer, wherein the second fluid meniscus is configured to confine the first fluid meniscus to prevent evaporation of a hot liquid chemistry included in the first fluid meniscus into a gas, wherein another gas is applied to the second fluid meniscus to confine the first fluid meniscus and the second fluid meniscus to a footprint on the wafer surface, the proximity head including:
(i) at least one first inlet configured to supply the hot liquid chemistry to the first fluid meniscus, and
(ii) at least one second inlet configured to supply a cold liquid chemistry to the second fluid meniscus;
(b) a first supply tank for providing the hot liquid chemistry to the at least one inlet;
(c) a second supply tank for supplying the cold liquid chemistry to the at least one second inlet; and
(d) a liquid pump for removing the hot liquid chemistry mixed with at least a portion of the cold liquid chemistry to each of the first and second supply tanks for recirculation back to the proximity head as the hot liquid chemistry and the cold liquid chemistry;
(e) a vacuum tank for receiving cold liquid chemistry removed from cold/gas fluid outlets.

2. The system as recited in claim 1, wherein the proximity head has conduits to enable the second fluid meniscus to substantially surround the first fluid meniscus.

3. The system as recited in claim 1, wherein the proximity head has conduits to enable the second fluid meniscus to at least partially surround the first fluid meniscus.

4. The system as recited in claim 1, wherein a temperature of the hot liquid chemistry is approximately 30 degrees Celsius to approximately 80 degrees Celsius.

5. The system as recited in claim 1, wherein a temperature of the cold liquid chemistry is approximately 5 degrees Celsius to approximately 20 degrees Celsius.

6. The system as recited in claim 1, wherein the hot liquid chemistry and the cold liquid chemistry include the same chemical composition.

7. The system as recited in claim 1, wherein the gas is ambient air.

8. The system as recited in claim 1, wherein the gas is an inert gases such as nitrogen, helium, or argon.

9. The system as recited in claim 1, wherein the proximity head further includes:
at least one hot/cold fluid outlet configured to remove a mixture of the hot liquid chemistry and the cold liquid chemistry from the wafer surface; and
at least one cold/gas fluid outlet configured to remove a mixture of the cold liquid chemistry and the gas from the wafer surface.

10. A liquid reclaim system, comprising:
(a) a proximity head capable of generating a first fluid meniscus and a second fluid meniscus on a surface of a wafer, wherein the second fluid meniscus is configured to confine the first fluid meniscus to prevent evaporation of a hot liquid chemistry included in the first fluid meniscus into a gas, wherein another gas is applied to the second fluid meniscus to confine the first fluid meniscus and the second fluid meniscus to a footprint on the wafer surface, the proximity head including:
(i) at least one first inlet configured to supply the hot liquid chemistry to the first fluid meniscus,
(ii) at least one second inlet configured to supply a cold liquid chemistry to the second fluid meniscus;
(b) a first supply tank coupled to the at least one first inlet via a first supply line, wherein the hot liquid chemistry is supplied from the first supply tank to the at least one first inlet along the first supply line;
(c) a second supply tank coupled to the at least one second inlet via a second supply line, wherein the cold liquid chemistry is supplied from the second supply tank to the at least one second inlet along the second supply line;
(d) a first apparatus coupled between at least one cold/gas outlet of the proximity head and the second supply tank, wherein the first apparatus is configured to remove the mixture of the cold liquid chemistry and the gas from the wafer surface along the at least one cold/gas outlet and into the first apparatus, and wherein the first apparatus is configured to separate the cold liquid chemistry from the gas to re-circulate the cold liquid chemistry into the second supply tank, and the first apparatus includes a vacuum tank; and
(e) a second apparatus coupled between at least one hot/cold outlet of the proximity head and the first supply tank and further coupled between the at least one hot/cold outlet and the second supply tank, wherein the second apparatus is configured to remove the the hot liquid chemistry and the cold liquid chemistry from the wafer surface along the at least one hot/cold outlet and move a mixture of the hot and cold liquid chemistry into the first supply tank and the second supply tank.

11. The system as recited in claim 10, wherein the second apparatus includes a liquid pump.

12. The system as recited in claim 1, wherein a temperature of the cold liquid chemistry is provided to produce a gas phase equilibrium that prevents evaporation of the cold liquid chemistry into the gas.

13. The liquid reclaim system as recited in claim 1, further comprising:
(f) another pump for moving cold liquid chemistry from the vacuum tank to the second supply tank.

14. The liquid reclaim system as recited in claim 13, wherein gas is separated from the cold liquid chemistry in the vacuum tank.

15. The liquid reclaim system as recited in claim 14, wherein the vacuum tank is separate from the first and second tanks to prevent mixture of gas with either the hot or cold liquid chemistries before being recalculated to the proximity head.

16. A proximity head system for processing a surface of a substrate, comprising:
(a) a proximity head for generating a first fluid meniscus and a second fluid meniscus on a surface of a substrate, the proximity head including: (i) a plurality of first inlets to supply a hot liquid chemistry to the first fluid meniscus, and (ii) a plurality of second inlets to supply a cold liquid chemistry to the second fluid meniscus;
(b) a first supply tank for providing the hot liquid chemistry to the plurality of first inlets;
(c) a second supply tank for supplying the cold liquid chemistry to the plurality of second inlets; and
(d) a pump coupled to the proximity head for removing the hot liquid chemistry and the cold liquid chemistry from the surface of the substrate, the pump removing mixed hot and cold liquid chemistry from the proximity head and returning a portion to the first tank and a portion to the second tank;
wherein on a surface of the proximity head, the plurality of second inlets are defined in an arrangement to at least partially surround the plurality of first inlets, the arrangement is configured to at least partially confine the first fluid meniscus with the second fluid meniscus to prevent evaporation of the hot liquid chemistry, included in the first fluid meniscus, into a gas.

* * * * *